United States Patent
Park et al.

(10) Patent No.: US 9,576,520 B2
(45) Date of Patent: Feb. 21, 2017

(54) DISPLAY DEVICE WITH GROOVE IN A NON-DISPLAY AREA AND METHOD OF MANUFACTURING THE SAME

(71) Applicant: SAMSUNG DISPLAY CO., LTD., Yongin, Gyeonggi-Do (KR)

(72) Inventors: DaeJin Park, Incheon (KR); Bumsoo Kam, Yongin-si (KR); Gilhwan Yeo, Hwaseong-si (KR); Hyung-Il Jeon, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 75 days.

(21) Appl. No.: 14/312,469

(22) Filed: Jun. 23, 2014

(65) Prior Publication Data

US 2015/0130777 A1 May 14, 2015

(30) Foreign Application Priority Data

Nov. 12, 2013 (KR) ........................ 10-2013-0136916

(51) Int. Cl.
*G09G 3/20* (2006.01)
*H01L 27/12* (2006.01)
*G02F 1/1333* (2006.01)

(52) U.S. Cl.
CPC .......... *G09G 3/2085* (2013.01); *G09G 3/2092* (2013.01); *H01L 27/1218* (2013.01);
(Continued)

(58) Field of Classification Search
CPC ...... G09G 3/00; G09G 3/2085; G09G 3/2092; G09G 2300/0439; G09G 2300/0426; G09G 2300/023; G09G 2300/026; H01L 27/14; H01L 27/1262; H01L 27/1218; H01L 27/3288; G02F 1/1345; G02F 1/13452; G02F 1/13336; G02F 1/1652; G02F 1/1637; G02F 1/1333; G02F 1/1347; G02F 1/133723; G02F 1/13; G02F 1/1303; G02F 1/1306; G02F 2001/133391; G02F 2001/133388

See application file for complete search history.

(56) References Cited

U.S. PATENT DOCUMENTS 5,838,405 A * 11/1998 Izumi .................... G02F 1/1339
156/275.7
7,576,706 B2 * 8/2009 Lim ..................... G09G 3/3611
324/760.01

(Continued)

FOREIGN PATENT DOCUMENTS

JP 2001-242831 9/2001
JP 2004-271632 9/2004
(Continued)

OTHER PUBLICATIONS

Korean Patent Abstracts Publication No. 10-2000-0052180 A, dated Aug. 16, 2000, for KR 10-0580824, 1 page.

*Primary Examiner* — Ariel Balaoing
*Assistant Examiner* — Darlene M Ritchie
(74) *Attorney, Agent, or Firm* — Lewis Roca Rothgerber Christie LLP

(57) ABSTRACT

A display device having a substrate including a first display area, a second display area, a non-display area disposed adjacent to the first and second display areas, a plurality of first pixels disposed in the first display area, a plurality of second pixels disposed in the second display area, a first groove disposed in the non-display area and recessed downward from an upper surface of the substrate, a first flexible film disposed in the first groove, and a plurality of pad electrodes disposed on the first flexible film in the non-display area between the first and second display areas and
(Continued)

connecting the first pixels are connected to the second pixels in a row.

16 Claims, 7 Drawing Sheets

(52) U.S. Cl.
CPC ............... *H01L 27/1262* (2013.01); *G02F 2001/133388* (2013.01); *G02F 2001/133391* (2013.01); *G09G 2300/026* (2013.01); *G09G 2300/0426* (2013.01); *G09G 2300/0439* (2013.01); *H01L 27/124* (2013.01); *H01L 2251/5338* (2013.01)

(56) References Cited

U.S. PATENT DOCUMENTS

| | | | | |
|---|---|---|---|---|
| 9,209,207 B2* | 12/2015 | Park | ................ | H01L 27/1259 |
| 9,318,542 B2* | 4/2016 | Choi | ................ | H01L 27/3246 |
| 2003/0063041 A1* | 4/2003 | Kurashima | ......... | G02F 1/13452 |
| | | | | 345/1.1 |
| 2007/0159094 A1* | 7/2007 | Oh | ................ | H01L 27/3223 |
| | | | | 313/512 |
| 2008/0100777 A1* | 5/2008 | Yasuda | ................ | G09G 3/3666 |
| | | | | 349/73 |
| 2010/0326708 A1* | 12/2010 | Hara | ................ | G02F 1/13336 |
| | | | | 174/257 |
| 2010/0328193 A1* | 12/2010 | Hara | ................ | H01L 27/3288 |
| | | | | 345/1.3 |
| 2010/0328921 A1* | 12/2010 | Hara | ................ | G02F 1/13336 |
| | | | | 361/809 |
| 2012/0056859 A1 | 3/2012 | Chen et al. | | |
| 2012/0162099 A1* | 6/2012 | Yoo | ................ | G06F 3/0412 |
| | | | | 345/173 |
| 2012/0190220 A1* | 7/2012 | Lee | ................ | G02F 1/13452 |
| | | | | 439/67 |
| 2012/0194773 A1* | 8/2012 | Kim | ................ | G02F 1/13336 |
| | | | | 349/139 |
| 2012/0218219 A1 | 8/2012 | Rappoport et al. | | |
| 2013/0002583 A1* | 1/2013 | Jin | ................ | G06F 1/1637 |
| | | | | 345/173 |
| 2013/0334543 A1* | 12/2013 | Kim | ................ | H01L 33/36 |
| | | | | 257/79 |
| 2014/0104246 A1* | 4/2014 | Rao | ................ | G09G 5/00 |
| | | | | 345/204 |
| 2014/0307397 A1* | 10/2014 | Osako | ................ | H05B 33/02 |
| | | | | 361/749 |

FOREIGN PATENT DOCUMENTS

| | | |
|---|---|---|
| JP | 2008-090329 | 4/2008 |
| JP | 2012-078570 | 4/2012 |
| KR | 10-2000-0003312 | 1/2000 |
| KR | 10-0580824 | 5/2006 |
| KR | 10-2011-0068169 | 6/2011 |
| KR | 10-2012-0030732 | 3/2012 |

* cited by examiner

DISPLAY DEVICE WITH GROOVE IN A NON-DISPLAY AREA AND METHOD OF MANUFACTURING THE SAME

CROSS-REFERENCE TO RELATED APPLICATION

This application claims priority to and the benefit of Korean Patent Application No. 10-2013-0136916, filed in the Korean Intellectual Property Office on Nov. 12, 2013, the entire content of which is hereby incorporated by reference.

BACKGROUND

1. Field

The present disclosure relates to a display device and a method of manufacturing the display device. More particularly, the present disclosure relates to a display device capable of reducing a non-display area and a method of manufacturing the display device.

2. Description of the Related Art

A display device includes a display panel to display an image and gate and data drivers to drive the display panel. The display panel includes gate lines, data lines, and pixels connected to the gate lines and the data lines. The gate lines receive gate signals from a gate driver and the data lines receive data voltages from a data driver. The pixels receive the data voltages through the data lines in response to the gate signals provided through the gate lines. The pixels display gray scales corresponding to the data voltages, and thus the desired images are displayed.

The display device may be a flat panel display device, e.g., a liquid crystal display device, a plasma display panel device, a field emission display device, an organic light emitting diode display device, an electrophoretic display device, or others.

The display device includes a display area in which the images area displayed and a non-display area disposed adjacent to the display area. The drivers used to drive the display panel are disposed in the non-display area in which the images are not displayed. In recent years, however, demand for the display device with wide display area keeps on increasing in the market, and thus a display device having a reduced non-display area is required.

SUMMARY

The present disclosure provides a display device capable of reducing a non-display area of a display panel.

The present disclosure provides a method of manufacturing the display device.

Embodiments of the inventive concept provide a display device including a substrate including a first display area, a second display area, and a non-display area disposed adjacent to the first and second display areas, a plurality of first pixels disposed in the first display area, a plurality of second pixels disposed in the second display area, a first groove disposed in the non-display area, the first groove being recessed downward from an upper surface of the substrate, a first flexible film disposed in the first groove, and a plurality of pad electrodes disposed on the first flexible film in the non-display area between the first display area and the second display area. The first pixels are connected to the second pixels through corresponding pad electrodes formed in a row.

Embodiments of the inventive concept provide a method of manufacturing the display device including preparing a substrate that includes a first display area, a second display area, and a non-display area disposed adjacent to the first and second display areas, etching the substrate in the non-display area to form a first groove recessed downward from an upper surface of the substrate, bonding a first flexible film in the first groove using a pressure sensitive adhesive, forming a plurality of pad electrodes on the first flexible film in the non-display area between the first display area and the second display area, forming a plurality of first pixels in the first display area, forming a plurality of second pixels in the second display area, connecting the first pixels to the second pixels in a unit and formed in a row through corresponding pad electrodes, and etching the substrate in the non-display area to form a second groove recessed upward from a lower surface of the substrate and overlapping with the first groove.

According to the above, the non-display area of the display device is reduced in size, and thus widening the display area of the display device.

BRIEF DESCRIPTION OF THE DRAWINGS

The above and other advantages of the present disclosure will become readily apparent by reference to the following detailed description when considered in conjunction with the accompanying drawings wherein.

DETAILED DESCRIPTION

Figure 1:
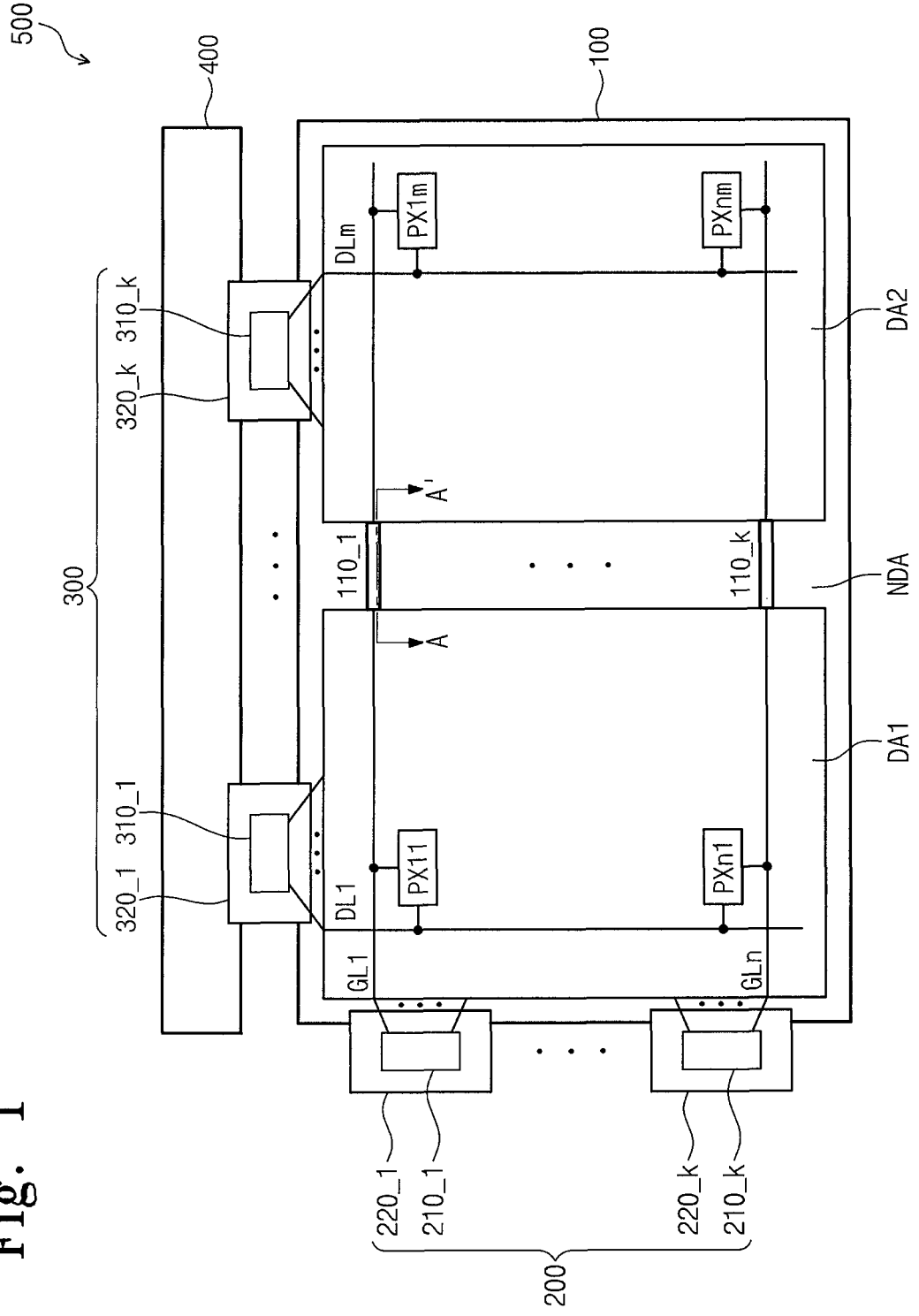
FIG. 1 is a block diagram illustrating a display device according to an exemplary embodiment of the present disclosure.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath", "below", "lower", "above", "upper" and the like, may be used herein for ease of description to describe one element or features relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the disclosure. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present disclosure will be explained in detail with reference to the accompanying drawings.

FIG. 1 is a block diagram showing a display device according to an exemplary embodiment of the present disclosure.

Referring to FIG. 1, a display device 500 includes a display panel 100, a gate driver 200, a data driver 300, and a driving circuit board 400.

The display panel 100 includes a first display area DA1, a second display area DA2, a non-display area NDA disposed adjacent to the first and second display areas DA1 and DA2, and a plurality of pad electrodes 110_1 to 110_k.

A plurality of pixels PX11 to PXnm is disposed in the first and second display areas DA1 and DA2. In detail, a plurality of first pixels are disposed in the first display area DA1 and a plurality of second pixels are disposed in the second display area DA2. The first pixels are connected to the second pixels through corresponding pad electrodes 110_1 to 110_k positioned in a row.

In the present exemplary embodiment, the display panel 100 includes the first and second display areas DA1 and DA2, however, it should not be limited thereto or thereby. That is, the display panel 100 may include a plurality of display areas, and the display areas may be electrically connected to each other in a row or column through corresponding pad electrodes. For instance, in an embodiment where that the display areas are disposed in a column, the pixels included in one display area may be connected to the pixels included in another display area through corresponding pad electrodes in a column.

In addition, the display panel 100 includes a plurality of gate lines GL1 to GLn and a plurality of data lines DL1 to DLm insulated from the gate lines GL1 to GLn and crossing the gate lines GL1 to GLn.

The gate lines GL1 to GLn are connected to the gate driver 200 to sequentially receive gate signals. The data lines DL1 to DLm are connected to the data driver 300 to receive data voltages in analog form.

The pixels PX11 to PXnm are disposed in areas defined by the gate lines GL1 to GLn and the data lines DL1 to DLm. Thus, the pixels PX11 to PXnm are arranged in n rows by m columns crossing each other. Each of "n" and "m" is an integer number greater than zero (0).

Each of the pixels PX11 to PXnm is connected to a corresponding gate line of the gate lines GL1 to GLn and a corresponding data line of the data lines DL1 to DLm. Each of the pixels PX11 to PXnm receives the data voltage through the corresponding data line of the data lines DL1 to DLm in response to the gate signal applied through the corresponding gate line of the gate lines GL1 to GLn. The pixels PX11 to PXnm display gray scales corresponding to the data voltages.

Figure 2:
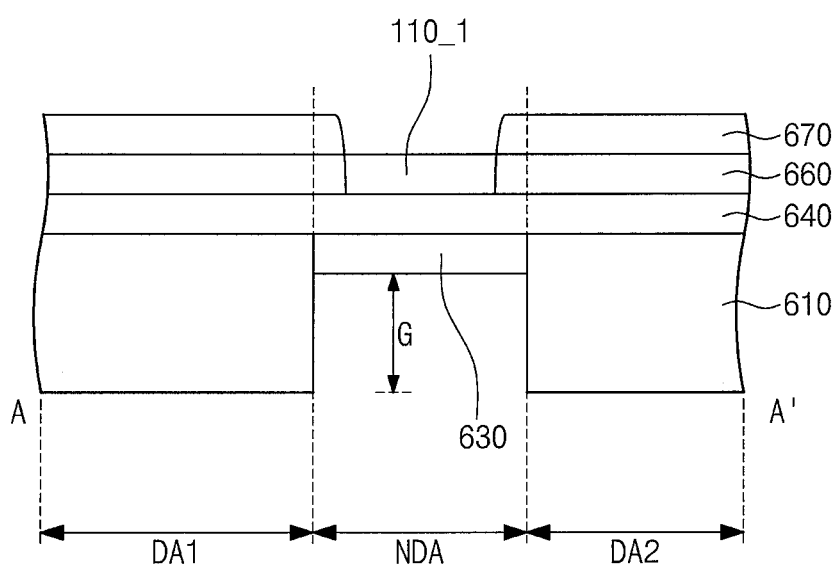
FIG. 2 is a cross-sectional view taken along a line A-A' of FIG. 1.

A first flexible film as illustrated in FIG. 2 is disposed in the non-display area NDA. The pad electrodes 110_1 to 110_k are disposed on the first flexible film as illustrated in FIG. 2 in the non-display area NDA between the first display area DA1 and the second display area DA2. The pad electrodes 110_1 to 110_k are arranged in a column direction and spaced apart from each other. In addition, the pad electrodes 110_1 to 110_k have a long side positioned in a row direction and a short side positioned in the column direction. The first pixels in the first display area DA1 are connected to the second pixels in the second display area DA2 in a row through corresponding pad electrodes 110_1 to 110_k. Details on the structure of the pad electrodes 110_1 to 110_k disposed on the first flexible film as illustrated in FIG. 2 will be described in detail with reference to FIGS. 3A to 3G.

The gate driver 200 generates the gate signals in response to a gate control signal applied from a timing controller (not shown) mounted on the driving circuit board 400. Although not shown in the figures, the gate control signal is applied to the gate driver 200 via a flexible circuit board prepared for the data driver 300. The gate signals are sequentially applied to the pixels PX11 to PXnm through the gate lines GL1 to GLn positioned in a row. Thus, the pixels PX11 to PXnm are driven in a row.

The gate driver 200 includes a plurality of gate driving chips 210_1 to 210_k. "k" is an integer number greater than 0 and smaller than "m". The gate driving chips 210_1 to 210_k are mounted on first flexible circuit boards 220_1 to 220_k, respectively. The first flexible circuit boards 220_1 to 220_k are connected to the non-display area NDA disposed adjacent to a left side of the first display area DA1.

The data driver 300 receives image signals and a data control signal from the timing controller. The data driver 300 generates the data voltages in analog form, which correspond to the image signals, in response to the data control signal. The data driver 300 applies the data voltages to the pixels PX11 to PXnm through the data lines DL1 to DLm.

The data driver 300 includes a plurality of source driving chips 310_1 to 310_k. "k" is an integer number greater than 0 and smaller than "m". The source driving chips 310_1 to 310_k are mounted on second flexible circuit boards 320_1 to 320_k, respectively, and connected between the driving circuit board 400 and the non-display area NDA disposed adjacent to an upper portion of the first and second display areas DA1 and DA2.

In the present exemplary embodiment, the gate and source driving chips are mounted on the first and second flexible circuit boards, respectively, in a tape carrier package (TCP)

manner. However, the gate and source driving chips may be mounted on the first and second flexible circuit boards, respectively, in a chip on glass (COG) manner.

The driving circuit board 400 includes the timing controller (not shown). The timing controller generates the image signals and the data control signal and applies the image signals and the data control signal to the data driver 300. The timing controller generates the gate control signal and applies the gate control signal to the gate driver 200.

In addition, in the present exemplary embodiment, the driving circuit board 400 is configured as a flexible substrate. Thus, the driving circuit board 400 has flexibility to be folded or bent.

As described above, the display device 500 according to the present exemplary embodiment does not need to have two gate drivers in order to drive the first pixels arranged in the first display area DA1 and the second pixels arranged in the second display area DA2. That is, the first pixels are electrically connected to the second pixels through the pad electrodes 110_1 to 110_k, and thus, the gate signal may be applied to the first and second pixels using one gate driver 200.

FIG. 2 is a cross-sectional view taken along a line A-A' of FIG. 1.

Referring to FIG. 2, the display panel 100 includes a substrate 610, a first flexible film 630 disposed on the substrate 610, an organic insulating layer 640, a first pad electrode 110_1, a first insulating layer 660, and a second insulating layer 670.

Although not shown in the figures, similar to the display panel 100, the substrate 610 includes the first display area DA1, the second display area DA2, and the non-display area NDA disposed adjacent to the first and second display areas DA1 and DA2.

A groove G is formed in the non-display area NDA. For the convenience of explanation, the groove G, which is formed in the non-display area NDA as shown in the cross-section taken along the line of A-A' of FIG. 1, may also be formed in other locations in the non-display area NDA shown in FIG. 1.

An upper surface of the substrate 610 is recessed downward to form the groove G. That is, the upper surface of the substrate 610 is recessed downward by a predetermined distance to form the groove G.

The first flexible film 630 is disposed in the groove G. For instance, the first flexible film 630 is inserted into the groove G to be disposed in the groove G. The organic insulating layer 640 is disposed on the first flexible film 630 and the substrate 610. The organic insulating layer 640 covers the first flexible film 630. As shown in FIG. 2, the first flexible film 630 is inserted into the groove G such that an upper surface of the first flexible film 630 matches with the upper surface of the substrate 610.

However, the upper surface of the first flexible film 630 may be disposed at a position higher than that of the upper surface of the substrate 610. The organic insulating layer 640 is formed by providing an organic material having fluidity on the first flexible film 630 and the substrate 610 and curing the organic material. Thus, the organic insulating layer 640 having a planarized upper surface is provided to the display panel 100.

The first pad electrode 110_1 is disposed on the organic insulating layer 640 in the non-display area NDA between the first display area DA1 and the second display area DA2. As described above, the first pixels in the first display area DA1 are connected to the second pixels in the second display area DA2 through the corresponding first pad electrode 110_1 in the row. For instance, the first gate line GL1, which connects the first pixels arranged in a first row, as illustrated in FIG. 1, extends in the row and is connected to the first pad electrode 110_1. In addition, the first gate line GL1, which connects the second pixels arranged in the first row, extends in the row and is connected to the first pad electrode 110_1. Thus, the first pixels arranged in the first row are connected to the second pixels arranged in the first row through the first pad electrode.

The first insulating layer 660 is disposed on the organic insulating layer 640. Although not shown in the figures, the gate lines and the data lines are disposed on the first insulating layer 660 to drive the first pixels in the first display area DA1 and the second pixels in the second display area DA2.

The second insulating layer 670 is disposed to correspond to thin film transistors in the first and second display areas DA1 and DA2. In addition, although not shown in the figures, the first insulating layer 660 may be disposed on the substrate 610 to cover gate electrodes of the thin film transistors.

In addition, upper substrates (not shown) may be disposed on the second insulating layer 670 to face the substrate 610. In such an embodiment, the upper substrates may be disposed on the second insulating layer 670 arranged in each of the first display area DA1 and the second display area DA2. A common electrode and a color filter may be disposed on each upper substrate arranged in the first display area DA1 and the second display area DA2.

As described above, the groove G may be formed anywhere in the non-display area NDA and a flexible film may be disposed in the groove G. As a result, the gate driver 200 or the data driver 300 as illustrated in FIG. 1 may be connected more effectively for display panel 100. For example, the gate driver 200 may be disposed in a rear side of the display panel 100 in a folded form through the flexible film 630. The gate driver 200 may be electrically connected to the display panel 100 through a pad electrode disposed on the flexible film 630.

FIGS. 3A to 3G are cross-sectional views taken along a line of A-A' to illustrate a manufacturing method of the display device.

Figure 3A:
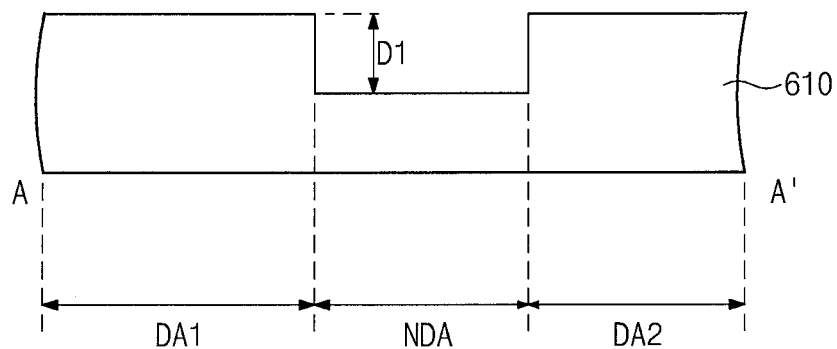
FIGS. 3A to 3G are cross-sectional views illustrating a manufacturing method of the display device according to an exemplary embodiment of the present disclosure.

Referring to FIG. 3A, the substrate 610 including the first display area DA1, the second display area DA2, and the non-display area NDA is prepared. The substrate 610 may be, but not limited to, an organic substrate. For the convenience of explanation, FIG. 3 shows only a portion of the substrate 610, which corresponds to the cross-section taken along the line of A-A' of FIG. 1.

The first groove having a predetermined thickness D1 is formed in the non-display area NDA through the substrate 610. The first groove is formed by etching the upper surface of the substrate 610 to allow the upper surface of the substrate 610 to be recessed downward.

Figure 3B:
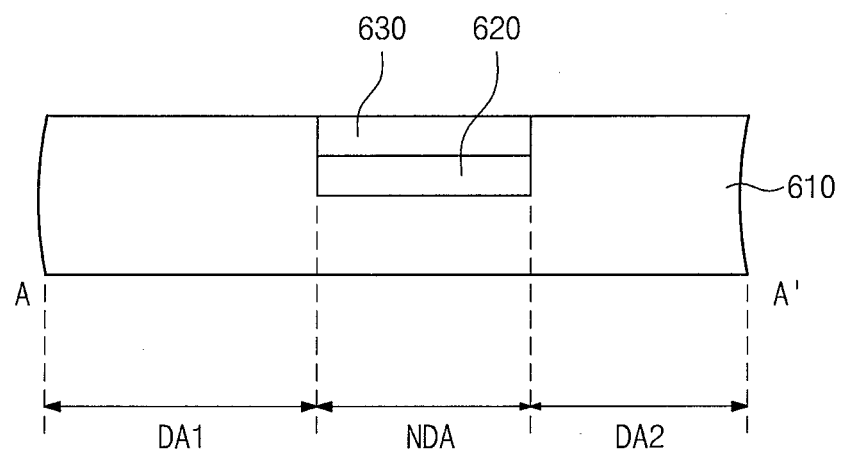

Referring to FIG. 3B, a pressure sensitive adhesive 620 is disposed in the first groove of the substrate 610. In addition, the first flexible film 630 is inserted into the first groove to be disposed on the pressure sensitive adhesive 620. The first flexible film 630 serves as a flexible film containing polyimide (PI). The first flexible film 630 is bonded to the first groove by the pressure sensitive adhesive 620. That is, the first flexible film 630 is bonded to the substrate 610 provided with the first groove by the pressure sensitive adhesive 620. Thus, the first flexible film 630 is fixed to the substrate 610 by the pressure sensitive adhesive 620.

The pressure sensitive adhesive 620 and the first flexible film 630 are disposed in the non-display area NDA.

Figure 3C:
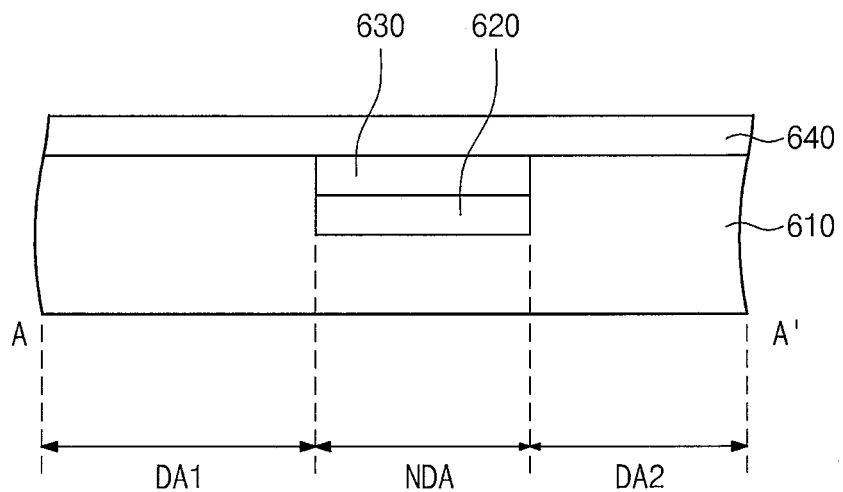

Referring to FIG. 3C, the organic insulating layer 640 is disposed on the first flexible film 630 and the substrate 610. The organic insulating layer 640 is disposed to cover the first flexible film 630. As shown in FIG. 2, the first flexible film 630 is inserted into the first groove such that the upper surface of the first flexible film 630 matches with the upper surface of the substrate 610. The organic insulating layer 640 is formed by providing organic material having fluidity on the first flexible film 630 and the substrate 610 and curing the organic material. Due to the organic insulating layer 640, an air gap between the first flexible film 630 disposed on the first groove of the substrate 610 and the substrate 610 is prevented.

Figure 3D:
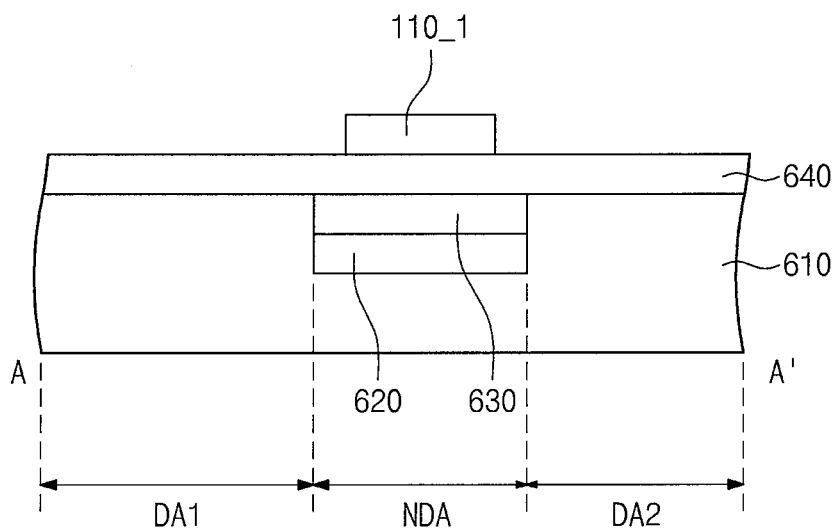

Referring to FIG. 3D, the first pad electrode 110_1 is disposed on the organic insulating layer 640 in the non-display area NDA between the first display area DA1 and the second display area DA2. As described above, the first pixels in the first display area DA1 are connected to the second pixels in the second display area DA2 through corresponding first pad electrode 110_1.

Figure 3E:
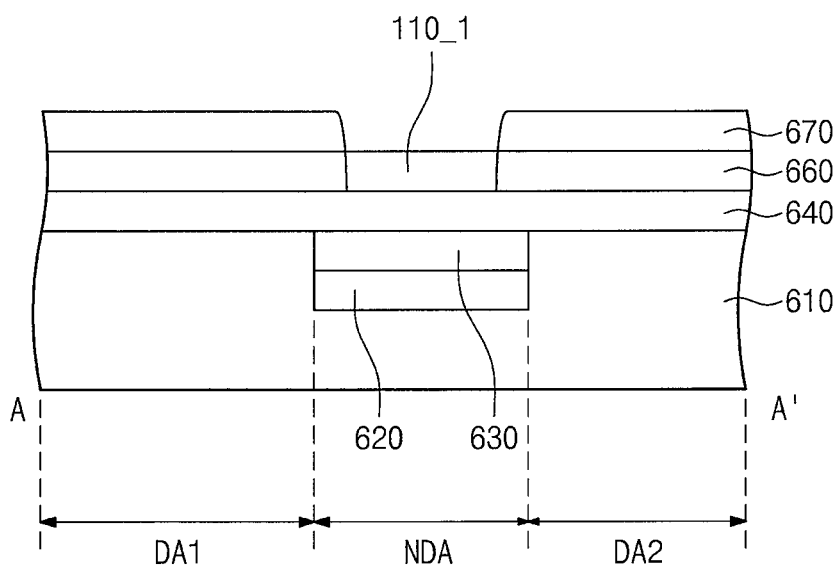

Referring to FIG. 3E, the first insulating layer 660 is disposed on the organic insulating layer 640 disposed in the first and second display areas DA1 and DA2.

Although not shown in figures, the pixels, the gate lines, and the data lines are disposed on the first insulating layer 660 to drive the display panel 100 as illustrated FIG. 1. Each of the pixels includes the thin film transistor (not shown) connected to the corresponding gate line and the corresponding data line and a pixel electrode connected to the thin film transistor. The thin film transistor receives the data voltage through the corresponding data line in response to the gate signal applied through the corresponding gate line.

The second insulating layer 670 is disposed on the thin film transistor disposed in the first display area DA1 and the thin film transistor disposed in the second display area DA2. Also, although not shown in the figures, the first insulating layer 660 may be disposed on the substrate 610 to cover the gate electrode of the thin film transistor.

In addition, the upper substrates may be disposed on the second insulating layer 670 to face the substrate 610. In this embodiment, the upper substrates may be disposed on the second insulating layer 670 disposed on each of the first and second display areas DA1 and DA2. The common electrode and the color filter may be disposed on the upper substrates disposed on the first and second display areas DA1 and DA2.

Figure 3F:
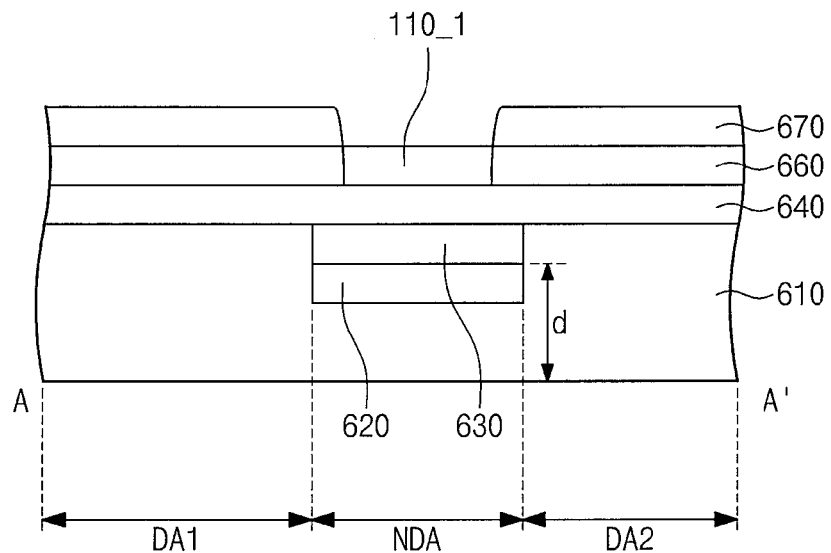
Figure 3G:
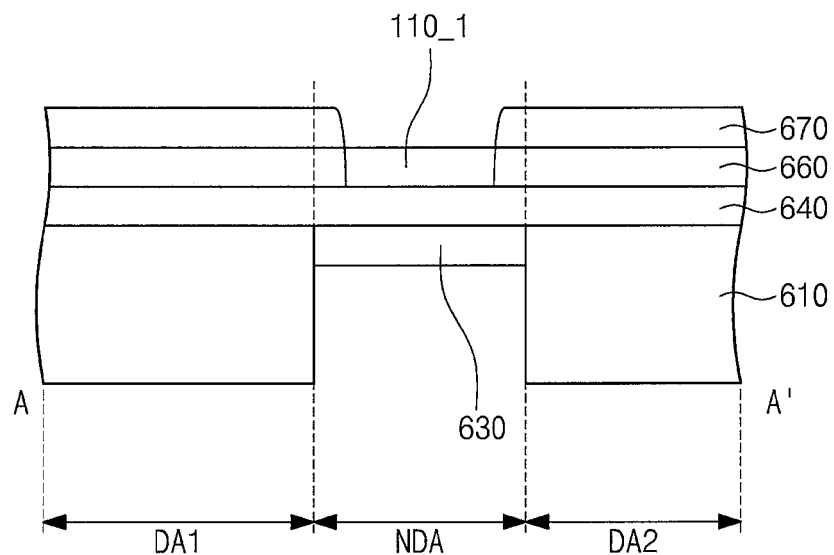

Referring to FIGS. 3F and 3G, the substrate 610 and the pressure sensitive adhesive 620 disposed in the non-display area NDA are removed. That is, a second groove recessed upward from a lower surface of the substrate 610 with a predetermined depth d is formed in the non-display area NDA. In the present exemplary embodiment, a laser beam may be used to remove the substrate 610 and the pressure sensitive adhesive 620 in the non-display area NDA.

As described above, the substrate 610 and the pressure sensitive adhesive 620 are removed from the non-display area NDA. That is, the first display area DA1 is connected to the second display area DA2 by the first flexible film 630. Also, since the first display area DA1 is connected to the second display area DA2 by the first flexible film 630, the non-display area NDA may be folded or bent, to thereby reduce the non-display area NDA in a display screen.

A conventional display panel requires a certain portion of the non-display area to mount gate and data drivers thereon. According to the display panel described in the present exemplary embodiment, however, the gate and data pads are disposed on the first flexible film 630 included in the non-display area NDA.

In the present exemplary embodiment, the gate pads (not shown) or fan-out parts (not shown) may be disposed on the first flexible film 630 formed in the non-display area NDA disposed adjacent to the left side of the first display area DA1. The data pads (not shown) or fan-out parts (not shown) may be disposed on the first flexible film 630 disposed adjacent to the upper portion of the first and second display areas DA1 and DA2.

Figure 4:
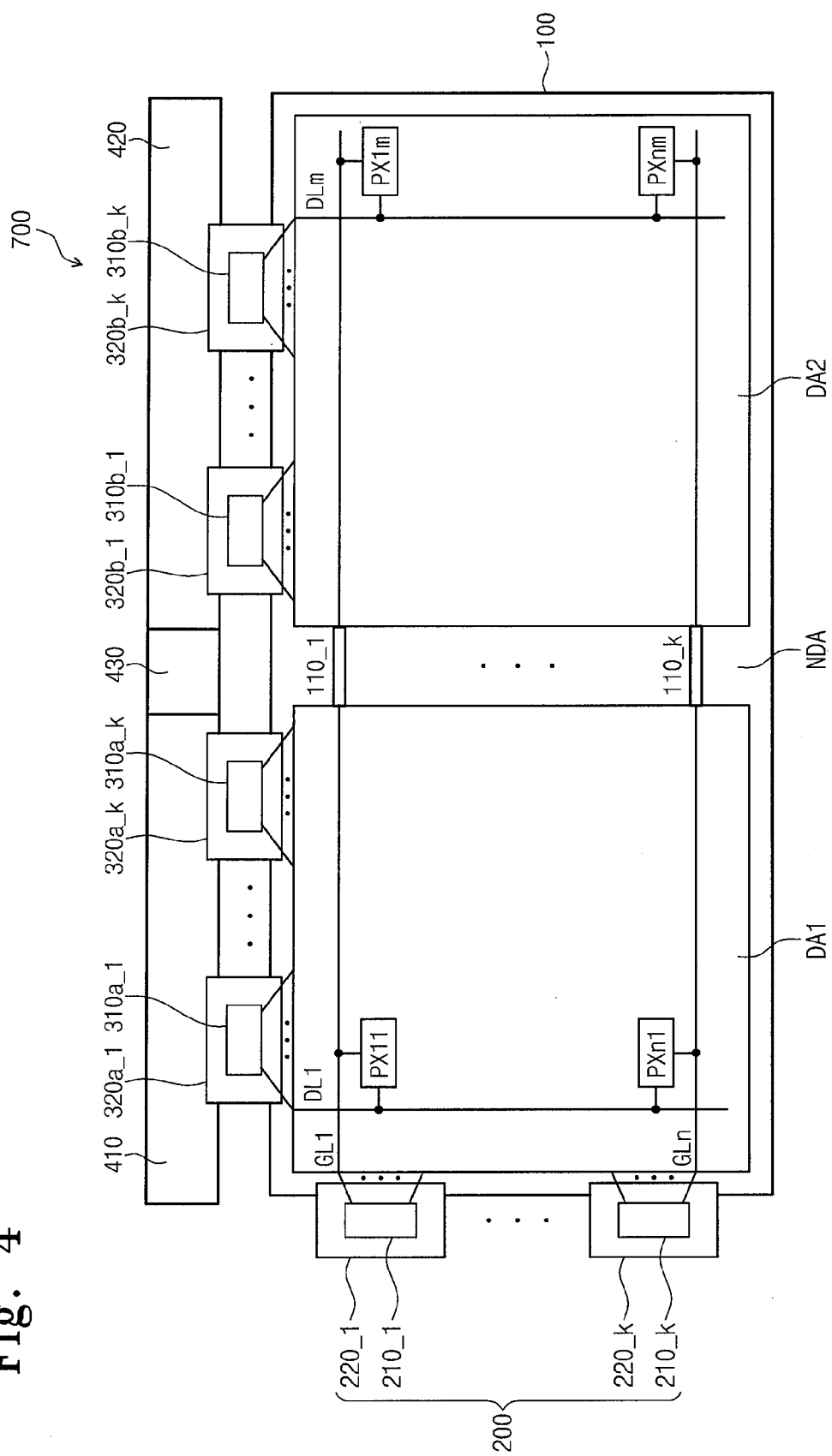
FIG. 4 is a block diagram illustrating a display device according to an exemplary embodiment of the present disclosure.

FIG. 4 is a block diagram illustrating a display device according to another exemplary embodiment of the present disclosure.

Referring to FIG. 4, a display device 700 has the same structure and function as that of the display device 500 shown in FIG. 1 except for a driving circuit board 400.

In the present exemplary embodiment, the display device 700 includes a first driving circuit board 410 and a second driving circuit board 420. The first driving circuit board 410 generates first image signals and a first data control signal and applies the first image signals and the first data control signal to a first data driver. The first data driver is connected to a non-display area NDA disposed adjacent to an upper portion of a first display area DA1.

The first data driver includes a plurality of first source driving chips 310a_1 to 310a_k. "k" is an integer number greater than 0 and smaller than "m". The first source driving chips 310a_1 to 310a_k are mounted on first flexible circuit boards 320a_1 to 320a_k, respectively. The first data driver converts the first image signals to first data voltages in response to the first data control signal.

The second driving circuit board 420 generates second image signals and a second data control signal and applies the second image signals and the second data control signal to the second data driver. The second data driver is connected to the non-display area NDA disposed adjacent to an upper portion of a second display area DA2.

The second data driver includes a plurality of second source driving chips 310b_1 to 310b_k. "k" is an integer number greater than 0 and smaller than "m". The second source driving chips 310b_1 to 310b_k are mounted on second flexible circuit boards 320b_1 to 320b_k, respectively. The second data driver converts the second image signals to second data voltages in response to the second data control signal.

In addition, the first driving circuit board 410 is electrically connected to the second driving circuit board 420 through a second flexible film 430. In the present exemplary embodiment, the second flexible film 430 may be configured as a flexible film, and the second flexible film 430 is folded or bent by the pad electrodes 110_1 to 110_k, which are folded or bent.

As described above, the display device according to the present disclosure has a structure in which two display areas disposed in one substrate are connected to each other instead of a structure in which display areas disposed in different substrates are connected to each other. Thus, the number of drivers required to drive the display device is reduced.

Although the exemplary embodiments of the present disclosure have been described, it is understood that the present disclosure should not be limited to these exemplary embodiments but various changes and modifications can be made by one ordinary skilled in the art within the spirit and scope of the present disclosure as hereinafter claimed.

What is claimed is:

1. A display device comprising:
a substrate including a first display area, a second display area, and a non-display area disposed adjacent to the first display area and the second display area, an opening being defined in the non-display area;
a plurality of first pixels are disposed in the first display area;
a plurality of second pixels are disposed in the second display area;
a first flexible film inserted into the opening in the non-display area;
an organic insulating layer on an upper surface of the substrate and covering the first flexible film;
an insulation layer on the organic insulating layer overlapping the first display area and the second display area; and
a plurality of pad electrodes disposed on the organic insulating layer in the non-display area and overlapping the first flexible film,
wherein the first pixels are connected to the second pixels through corresponding ones of the pad electrodes positioned in a row, and
wherein the substrate has a groove formed beneath a bottom surface of the first flexible film in the non-display area.

2. The display device of claim 1, wherein the first flexible film comprises polyimide.

3. The display device of claim 1, wherein the substrate is an organic substrate.

4. The display device of claim 1, wherein the first flexible film is inserted into the opening such that an upper surface of the first flexible film matches with the upper surface of the substrate.

5. The display device of claim 1, further comprising a gate driver providing a plurality of gate signals in the first pixels and the second pixels through a plurality of gate lines,
wherein the gate signals are provided in the first pixels and the second pixels in a row.

6. The display device of claim 5, further comprising a data driver providing a plurality of data voltages to the first pixels and the second pixels,
wherein the data driver converts a plurality of image signals to data voltages in response to a data control signal.

7. The display device of claim 6, further comprising a driving circuit board connected to the data driver which applies the data control signal and the image signals to the data driver, and applies a gate control signal to the gate driver via the data driver.

8. The display device of claim 7, wherein the driving circuit board is configured as a flexible substrate.

9. The display device of claim 6, wherein the data driver comprises:
a first data driver configured to convert first image signals to first data voltages in response to a first data control signal; and
a second data driver configured to convert second image signals to second data voltages in response to a second data control signal.

10. The display device of claim 9, further comprising:
a first driving circuit board connected to the first data driver configured to apply the first image signals and the first data control signal to the first data driver; and
a second driving circuit board connected to the second data driver configured to apply the second image signals and the second data control signal to the second data driver.

11. The display device of claim 10, further comprising a second flexible film to connect the first driving circuit board to the second driving circuit board.

12. A method of manufacturing a display device, comprising:
preparing a substrate that includes a first display area, a second display area, and a non-display area disposed adjacent to the first display area and second display area;
etching the substrate in the non-display area to form a first groove recessed downward from an upper surface of the substrate;
bonding a first flexible film in the first groove using a pressure sensitive adhesive;
forming a plurality of pad electrodes on the first flexible film in the non-display area between the first display area and the second display area;
forming a plurality of first pixels in the first display area;
forming a plurality of second pixels in the second display area;
connecting the first pixels to the second pixels in a row through the plurality of pad electrodes; and
etching the substrate in the non-display area to form a second groove recessed upward from a lower surface of the substrate and overlapping with the first groove.

13. The method of claim 12, further comprising forming an organic insulating layer on the first flexible film, wherein the pad electrodes are formed on the organic insulating layer.

14. The method of claim 12, wherein the forming of the second groove comprises removing the pressure sensitive adhesive.

15. The method of claim 12, wherein the first flexible film comprises polyimide.

16. The method of claim 12, wherein the substrate is an organic substrate.

* * * * *